United States Patent
Huang et al.

[11] Patent Number: 6,093,619
[45] Date of Patent: Jul. 25, 2000

[54] METHOD TO FORM TRENCH-FREE BURIED CONTACT IN PROCESS WITH STI TECHNOLOGY

[75] Inventors: Kuo Ching Huang, Kaohsiung; Tse-Liang Ying; Chia-Shiung Tsai, both of Hsin-Chu, all of Taiwan

[73] Assignee: Taiwan Semiconductor Manufaturing Company, Hsin-Chu, Taiwan

[21] Appl. No.: 09/099,809

[22] Filed: Jun. 18, 1998

[51] Int. Cl.[7] ............................................... H01L 21/76
[52] U.S. Cl. ......................... 438/400; 438/238; 438/357
[58] Field of Search ..................... 438/400, 357, 438/238

[56] References Cited

U.S. PATENT DOCUMENTS

| | | | |
|---|---|---|---|
| 4,238,278 | 12/1980 | Antipor | 156/657 |
| 5,433,794 | 7/1995 | Fazan et al. | 148/33.3 |
| 5,494,848 | 2/1996 | Chin | 437/191 |
| 5,506,168 | 4/1996 | Morita et al. | 437/67 |
| 5,521,422 | 5/1996 | Mandelman et al. | 257/510 |
| 5,672,538 | 9/1997 | Liaw et al. | 437/69 |
| 5,783,476 | 7/1998 | Arnold | 438/425 |
| 5,817,567 | 10/1998 | Jang et al. | 438/427 |

OTHER PUBLICATIONS

Fazan et al. "A Highly Manufacturable Trench Isolation Process for Deep Submicron DRAMs", IEDM, 193, by IEEE, pp. 57–60.

*Primary Examiner*—David Nelms
*Assistant Examiner*—Pho Luu
*Attorney, Agent, or Firm*—George O. Saile; Stephen B. Ackerman; Rosemary L. S. Pike

[57] ABSTRACT

A new method of forming a buried contact junction in a process involving shallow trench isolation is described. A first silicon oxide layer is deposited over a pad oxide layer on the surface of a semiconductor substrate. An opening is etched in the first silicon nitride and pad oxide layers where they are not covered by a mask. The substrate underlying the opening is etched into to form a shallow trench. An oxide material is deposited over the surface of the first silicon nitride layer and within the shallow trench and planarized to the surface of the first silicon nitride layer wherein the oxide material forms a STI region. The first silicon nitride layer is removed whereby the STI protrudes above the pad oxide layer. The pad oxide layer is removed whereby the corners of the STI above the substrate are also removed. A second silicon nitride layer is deposited overlying a sacrificial oxide layer and etched away to leave silicon nitride spacers filling in and rounding the corners of the STI. The sacrificial oxide layer is removed. A gate electrode and source/drain regions are formed in and on the substrate wherein a source/drain is adjacent to the STI. The gate electrode and STI are covered with an insulating layer. An opening is etched through the insulating layer to the source/drain region wherein the silicon nitride spacer at the corner of the STI prevents etching of the STI. The opening is filled with a conducting layer to complete formation of a contact.

16 Claims, 8 Drawing Sheets

6,093,619

METHOD TO FORM TRENCH-FREE BURIED CONTACT IN PROCESS WITH STI TECHNOLOGY

BACKGROUND OF THE INVENTION (1) Field of the Invention

The invention relates to the fabrication of integrated circuit devices, and more particularly, to a method of avoiding a buried contact trench at the edge of a shallow trench isolation (STI) region in the fabrication of integrated circuit devices.

(2) Description of the Prior Art

As device dimensions increase in order to permit higher device density, improved performance, and lower cost of integrated circuits, there is a growing demand for more effective isolation technology. LOCal Oxidation of Silicon (LOCOS) has been widely used in the art for forming isolation regions to insulate one active region from another. Due to encroachment such as "bird's beak" that occurs in LOCOS applications, shallow trench isolation (STI) has come into widespread use. However, the design rule for the extension of the active region to the field isolation becomes smaller for STI; for example, less than 0.1 micron for the 0.25 micron design rule. Thus, if mask misalignment occurs during the buried contact etching process, an uncontrollable leakage current may be induced since the STI trench provides a leakage path.

FIG. 1 illustrates an integrated circuit device of the prior art. A shallow trench isolation region 12 has been formed in a semiconductor substrate 10. A gate electrode 15 has been formed on the surface of the substrate. A contact 33 is to be made through the insulating layer 31 to the buried contact 27. If the mask for etching the opening through the insulating layer is misaligned, a portion of the STI 12 will be etched into. The conducting material 33 will be deposited within the opening and within the etched out portion of the trench, causing a leakage path 35, resulting in device failure.

U.S. Pat. No. 5,433,794 to Fazan et al teaches the use of silicon oxide spacers on the upper sides of a STI region. However, silicon oxide spacers will not prevent the formation of a buried contact trench within the STI region. U.S. Pat. No. 5,521,422 to Mandelman et al teach silicon nitride spacers on the upper edges of a STI region. However, the width of the spacers is not easily controlled. If the STI region is very small, the spacers may fill the STI opening preventing the etching of a trench. U.S. Pat. No. 5,506,168 to Morita et al also teaches silicon nitride spacers on the upper sides of STI regions. These spacers encroach into the active device area decreasing device density. U.S. Pat. No. 5,672,538 to Liaw et al teaches an oxide spacer on a field oxide region to smooth out the bird's head and bird's neck areas. U.S. Pat. No. 4,238,278 to Antipov teaches a method of forming both deep and shallow trenches. The paper "A Highly Manufacturable Trench Isolation Process for Deep Submicron DRAMs," by Fazan et al, *IEDM* 93, c. 1993 by IEEE, pp. 57–60, discloses the use of oxide spacers to smooth the corners of STI regions and to reduce junction leakage by forming sloped trenches and vertical B field implants. None of these patents fully solve the problem of a leakage path through an STI trench.

SUMMARY OF THE INVENTION

A principal object of the present invention is to provide an effective and very manufacturable method of forming a buried contact in a process using shallow trench isolation (STI).

Another object of the present invention is to provide a method of forming a buried contact wherein shallow trench isolation will not be harmed by mask misalignment.

A further object of the present invention is to provide a method of forming a buried contact wherein a buried contact trench will not be etched into a shallow trench isolation region.

In accordance with the objects of this invention a new method of forming a buried contact junction in a process involving shallow trench isolation is achieved. A shallow trench isolation (STI) region is formed to separate an active area of a semiconductor substrate from other active areas by the following steps. A pad oxide layer is provided over the surface of the semiconductor substrate. A first silicon nitride layer is deposited over the pad oxide layer. An opening is etched in the first silicon nitride and pad oxide layers where they are not covered by a mask. The semiconductor substrate underlying the opening is etched into to form a shallow trench. An oxide material is deposited over the surface of the first silicon nitride layer and within the shallow trench. The oxide material is planarized to the surface of the first silicon nitride layer wherein the oxide material forms a STI region. The first silicon nitride layer is removed whereby the STI protrudes above the pad oxide layer. The pad oxide layer is removed whereby the corners of the STI above the semiconductor substrate are also removed. A sacrificial oxide layer is formed on the surface of the semiconductor substrate. A second silicon nitride layer is deposited overlying the sacrificial oxide layer. The second silicon nitride layer is etched away to leave silicon nitride spacers filling in and rounding the corners of the STI. The sacrificial oxide layer is removed. A gate electrode is formed on the surface of the semiconductor substrate in the active region. A source/drain region is formed in the semiconductor substrate adjacent to the gate electrode and adjacent to the STI. The gate electrode and STI are covered with an insulating layer. An opening is etched through the insulating layer to the source/drain region wherein the silicon nitride spacer at the corner of the STI prevents etching of the STI. The opening is filled with a conducting layer to complete formation of a contact in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 2:
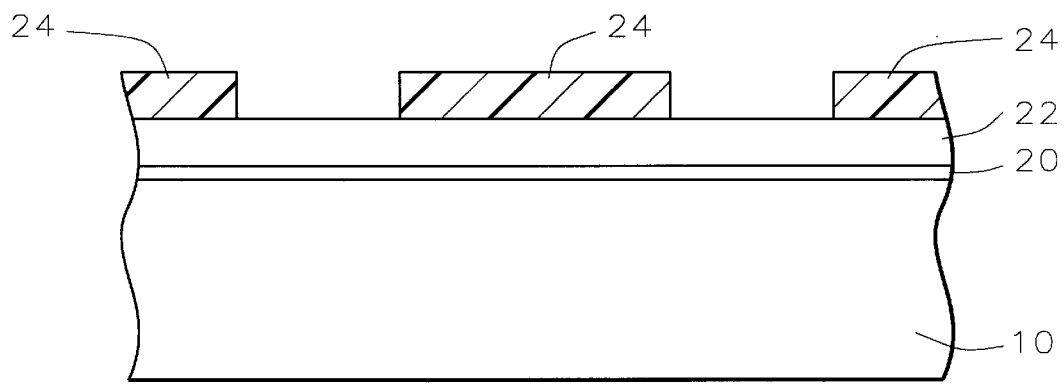
FIGS. 2 through 16 schematically illustrate in cross-sectional representation a preferred embodiment of the present invention.

Referring now more particularly to FIG. 2, there is shown a portion of a partially completed integrated circuit. There is shown a monocrystalline semiconductor substrate 10, preferably having a (100) crystallographic orientation. Shallow Trench Isolation (STI) regions will now be formed in the substrate in order to separate active areas from one another.

A layer of pad oxide 20 is grown or deposited over the surface of the substrate to a thickness of between about 50 and 300 Angstroms. A silicon nitride layer 22 is deposited over the pad oxide layer 20 to a thickness of between about 500 and 3000 Angstroms. Next, a layer of photoresist is coated over the silicon nitride layer and patterned as is conventional in the art to form a photoresist mask 24 with openings where the STI regions are to be formed.

Figure 3:
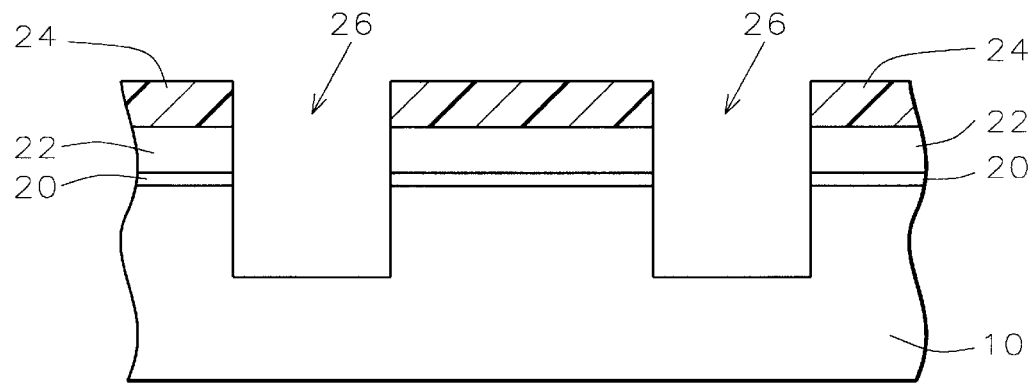

Referring now to FIG. 3, The silicon nitride and silicon oxide layers 22 and 20 are etched through to the silicon substrate where they are not covered by the mask 24. Then, the exposed semiconductor substrate is etched into to a depth of between about 1000 and 3000 Angstroms to form shallow trenches 26.

Figure 4:
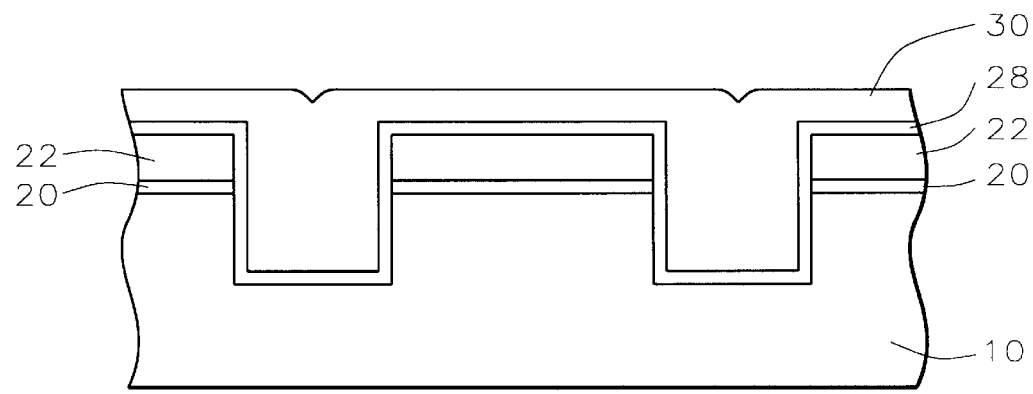

The photoresist mask is now removed. A lining oxide layer 28 is grown over the surface of the substrate and within the trenches 26 to a thickness of between about 100 and 300 Angstroms, as illustrated in FIG. 4.

A layer of silicon oxide 30 is deposited over the surface of the substrate and filling the trenches 26. Typically, this oxide layer is deposited by subatmospheric chemical vapor deposition (SACVD).

Figure 5:
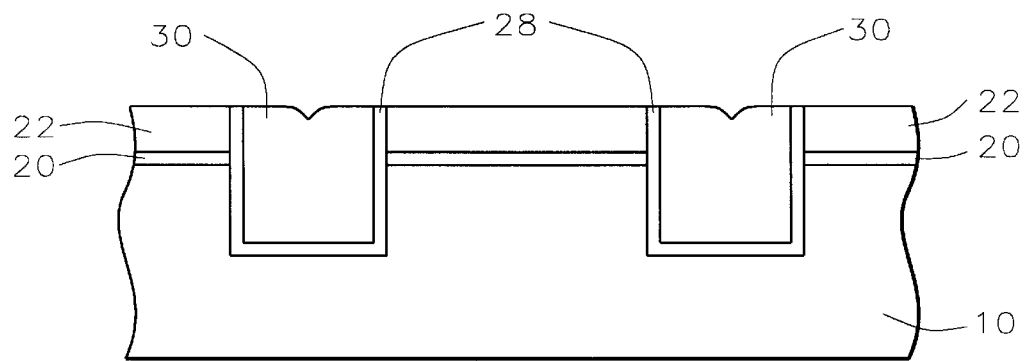

Referring now to FIG. 5, the SACVD oxide layer 30 and the lining oxide 28 are planarized, for example by chemical mechanical polishing (CMP), to the silicon nitride surface. The lining oxide layer 28 within the shallow trench isolation regions will no longer be shown because it is indistinguishable from the SACVD oxide layer 30.

Figure 6:
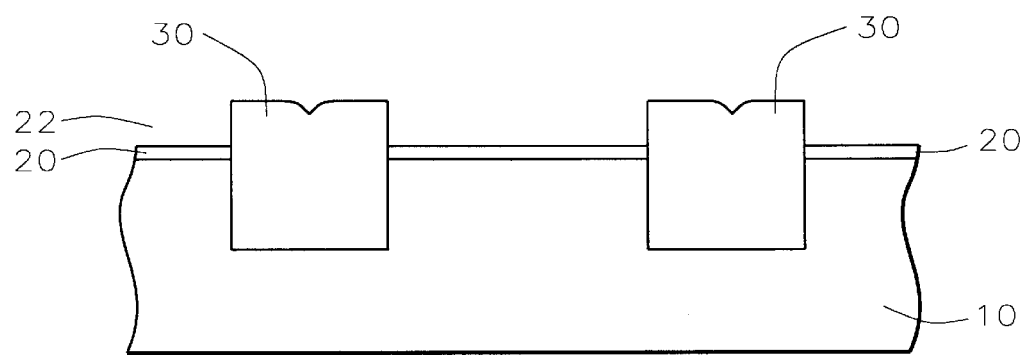
Figure 7:
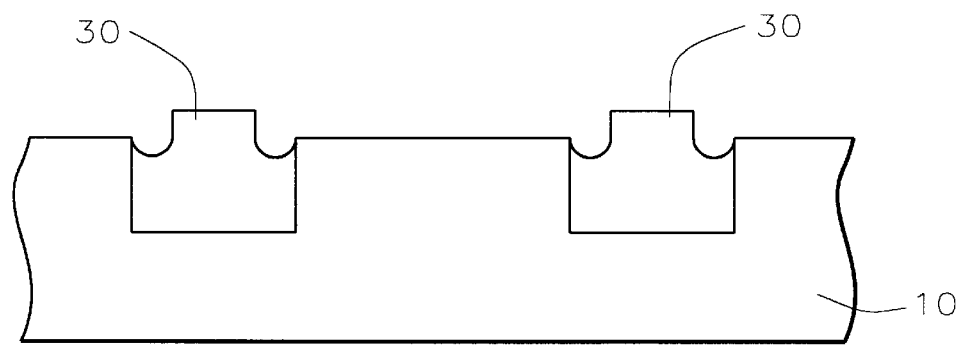

The silicon nitride layer 22 is now removed, as is conventional in the art, and as shown in FIG. 6. Now, the pad oxide layer 20 is to be removed. Typically, the pad oxide layer is removed by a wet etching process. The removal of the pad oxide layer also results in removing the STI oxide 30 above the level of the pad oxide and the corner portions of the STI oxide adjacent the removed pad oxide. This is illustrated in FIG. 7.

Figure 8:
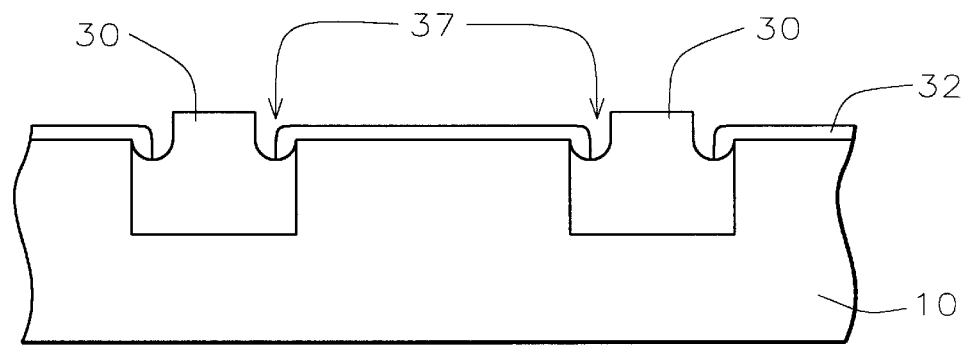

Now, referring to FIG. 8, a sacrificial oxide layer 32 is grown on the surface of the semiconductor substrate to a thickness of between about 50 to 200 Angstroms. The sacrificial oxide layer acts as a buffer layer for the silicon nitride layer to be deposited subsequently to protect the underlying silicon substrate from damage caused by the large tensile strength of the silicon nitride. This oxide layer also eliminates the "white ribbon" effect, in which there exists a narrow region of nonoxidized silicon caused by the diffusion of nitrogen-like material from the compressive-stressed nitride layer edge into the neighboring underlying tensile-stressed pad oxide layer.

Up to this point, the formation of the shallow trench isolation has been conventional. The thinner oxide at the corner regions 37 of the STI regions will facilitate leakage if there is mask misalignment in etching a buried contact in subsequent steps.

Figure 9:
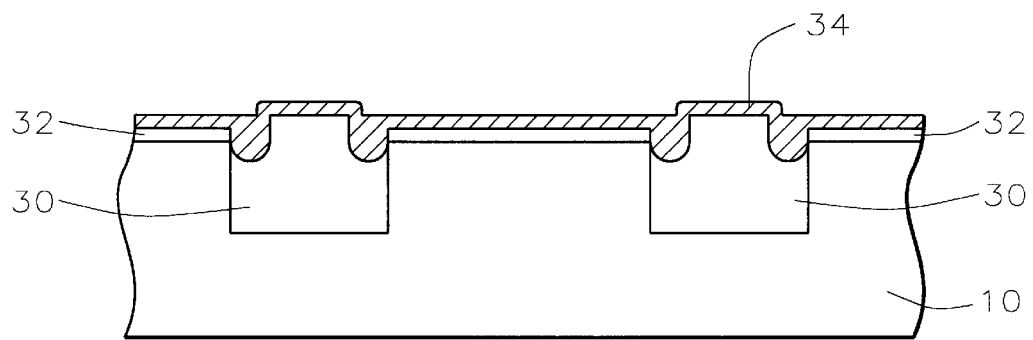

The process of the present invention prevents the formation of a leakage path through the STI regions. Referring now to FIG. 9, a silicon nitride layer 34 is deposited over the sacrificial oxide layer 32 to a thickness of between about 100 and 2000 Angstroms.

Figure 10:
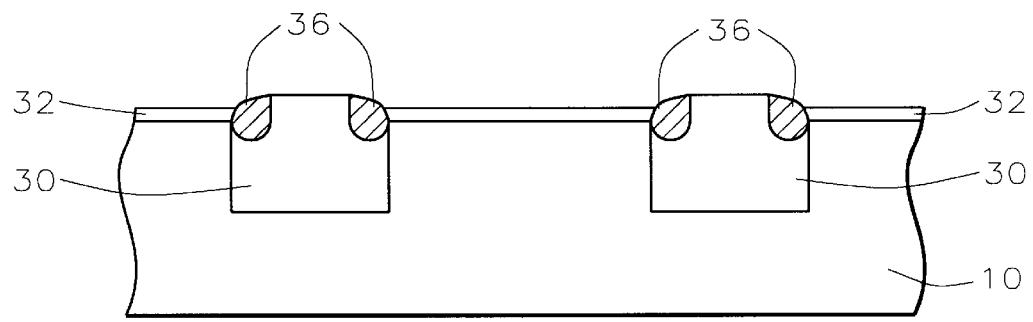

Next, referring to FIG. 10, the silicon nitride layer 34 is anisotropically etched back, as is conventional in the art, to leave silicon nitride spacers 36 which fill in and round off the corners of the STI regions. The silicon nitride spacers 36 will serve as a stopping layer if mask misalignment occurs to prevent etching through the STI region. The spacers 36 do not encroach into the active area, but are formed only within the corner portions of the STI regions.

Figure 11:
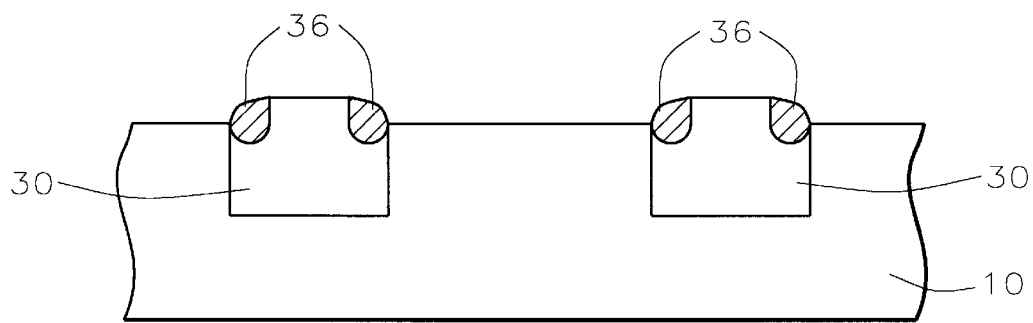

Referring now to FIG. 11, the sacrificial pad oxide layer is removed using, for example, a wet dip. Now, semiconductor devices are to be formed in the active regions. For example, gate electrodes, source and drain regions, and contacts to those regions are to be formed.

Figure 12:
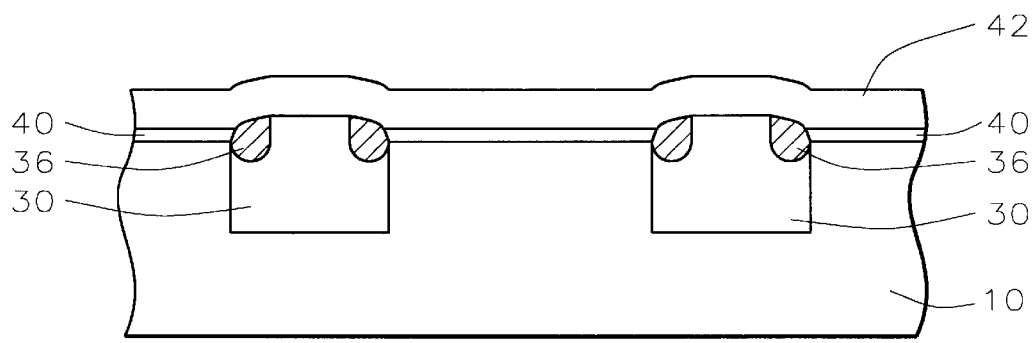

Referring now to FIG. 12, a gate oxide layer 40 is grown on the surface of the substrate, to a typical thickness of between about 30 and 200 Angstroms. A gate material layer, such as polysilicon 42, is deposited over the gate oxide layer and the STI regions to a thickness of between about 500 and 2500 Angstroms.

Figure 13:
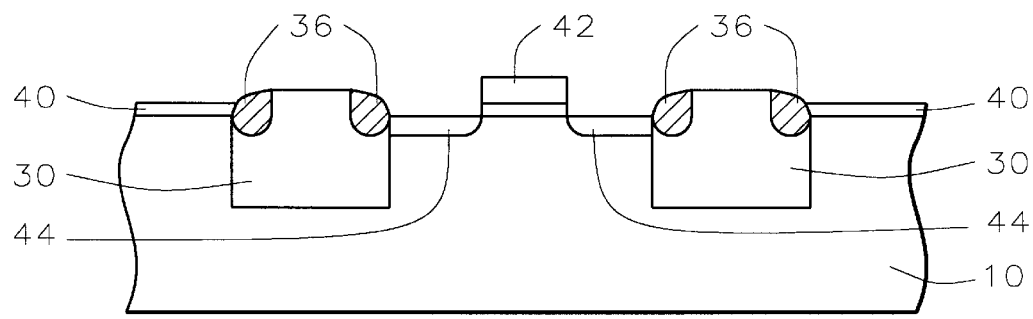

The gate material layer is etched away where it is not covered by a mask to form a gate electrode 42, as illustrated in FIG. 13. Lightly doped regions 44 are formed in the semiconductor substrate surrounding the gate electrode 42.

Figure 14:
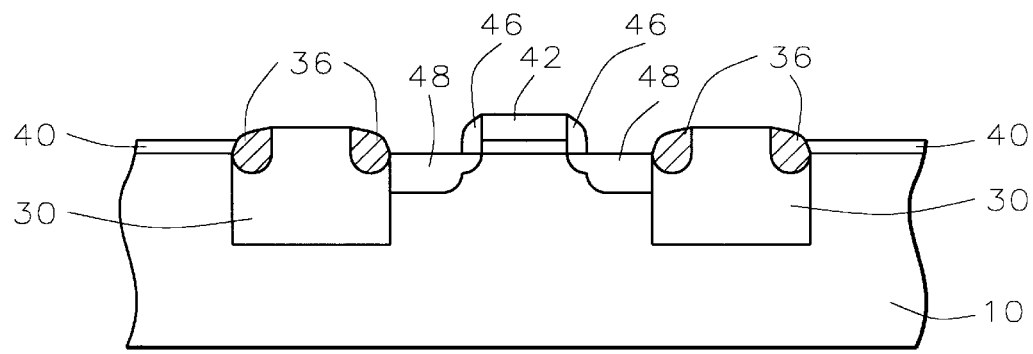
Figure 15:
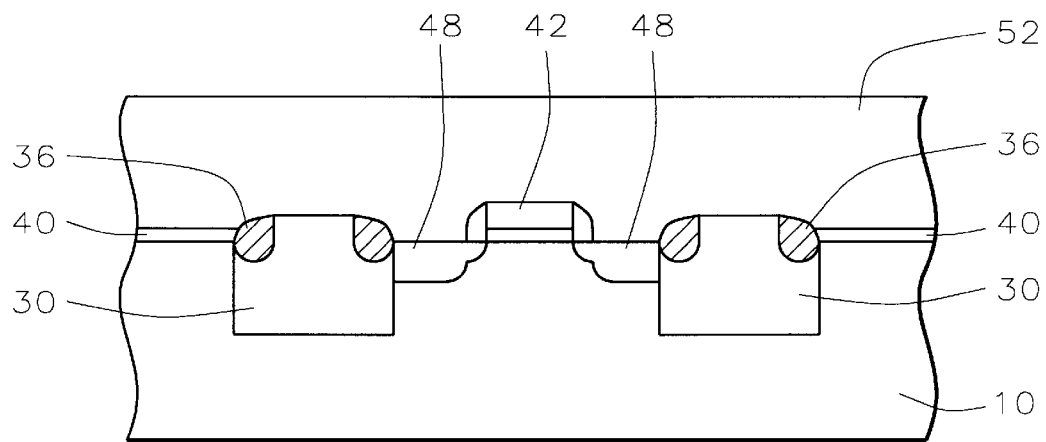

Referring now to FIG. 14, sidewall spacers 46 are formed on the sidewalls of the gate electrode 42. The gate electrode and sidewall spacers serve as a mask during the implantation of heavily doped source and drain regions 48.

An insulating layer 52 is deposited over the semiconductor device structures. This insulating layer may be silicon oxide, borophosphosilicate glass (BPSG), or the like, or a combination of insulating materials.

Figure 1:
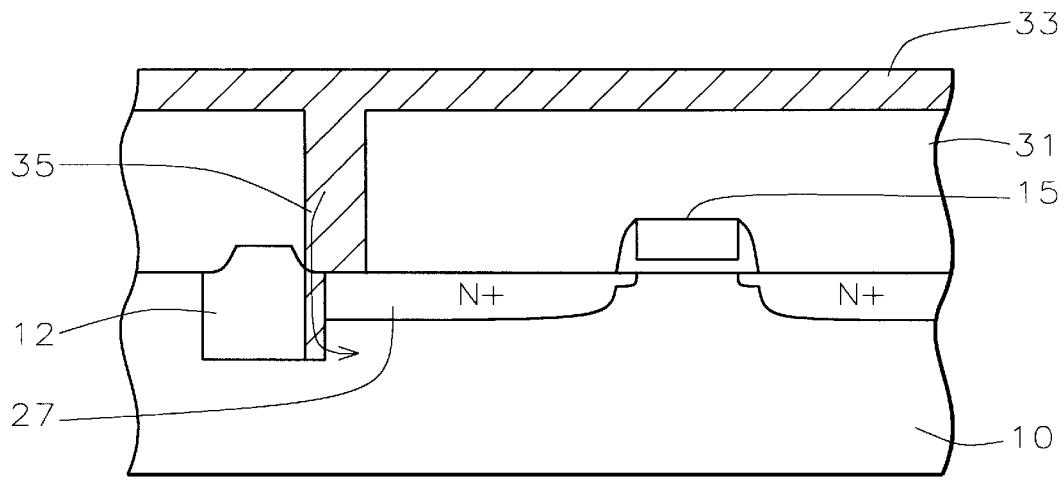
FIG. 1 schematically illustrates in cross-sectional representation an embodiment of the prior art.
Figure 16:
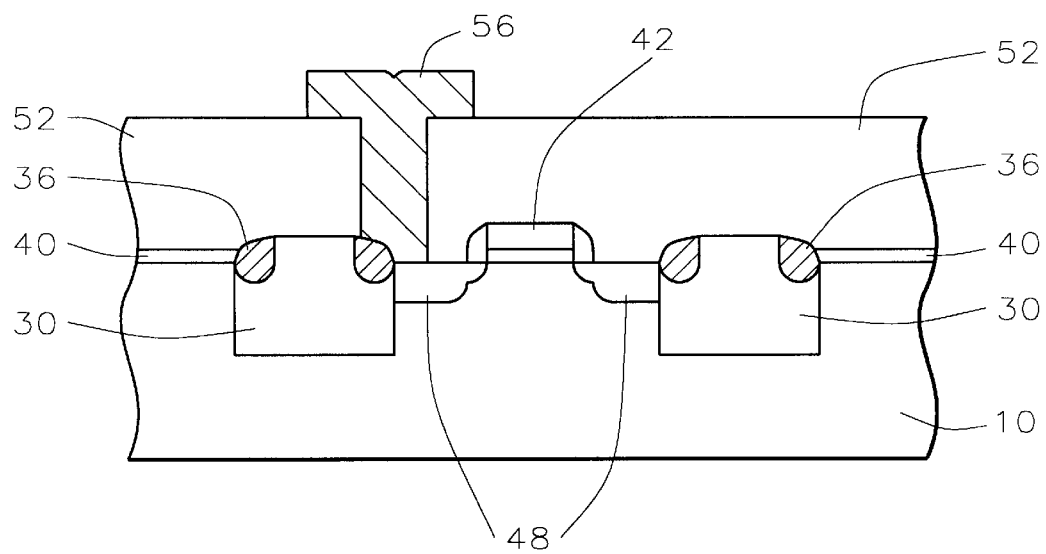

Now a contact opening is to be etched through the insulating layer 52 to one of the underlying source and drain regions 48. Because of the small design rule, the spacing between the gate electrode and the STI region is very close. If there is even a slight misalignment of the contact mask, the corner portion of the STI region will be exposed. In the prior art, this lead to a leakage path as shown in FIG. 1. However, in the process of the present invention, the silicon nitride corner spacer 36 acts as an etch stop so that the STI region will not be etched into. As shown in FIG. 16, the corner of the STI region 30 was exposed within the contact opening. The silicon nitride spacer 36 acts as an etch stop to prevent etching of the STI material 30.

Processing continues as is conventional in the art to fill the contact opening with a conducting layer, such as aluminum, and to pattern the conducting layer to complete the contact, as illustrated in FIG. 16.

The process of the present invention adds the step of forming silicon nitride spacers in the corner regions of the shallow trench isolation regions, using the inherent step height at the tops of the STI. The silicon nitride spacers act as a stopping layer for the bottom contact etching process to prevent the etching of a buried contact trench into the STI region. This prevents contact leakage and improves yield. The presence of the silicon nitride spacers also provides immunity from the "kink effect" caused by a thinner pad oxide at the edges of the STI region. Because of the presence of the silicon nitride spacers, the pad oxide layer 40 has the same thickness throughout the active region.

While the invention has been particularly shown and described with reference to the preferred embodiments thereof, it will be understood by those skilled in the art that various changes in form and details may be made without departing from the spirit and scope of the invention.

What is claimed is:

1. A method of forming a contact in the fabrication of an integrated circuit device comprising:

providing a pad oxide layer over the surface of a semiconductor substrate;

depositing a first silicon nitride layer over said pad oxide layer;

etching an opening in said first silicon nitride and said pad oxide layers where they are not covered by a mask;

etching into said semiconductor substrate underlying said opening to form a shallow trench;

depositing an oxide material over the surface of said first silicon nitride layer and within said shallow trench;

planarizing said oxide material to said surface of said first silicon nitride layer wherein said oxide material forms a shallow trench isolation (STI) region;

removing said first silicon nitride layer whereby said STI protrudes above said pad oxide layer;

removing said pad oxide layer whereby the corners of said STI above said semiconductor substrate are also removed;

forming a sacrificial oxide layer on the surface of said semiconductor substrate;

depositing a second silicon nitride layer overlying said sacrificial oxide layer;

etching away said second silicon nitride layer to leave silicon nitride spacers filling in and rounding said corners of said STI;

thereafter removing said sacrificial oxide layer;

forming a gate electrode on the surface of said semiconductor substrate adjacent to said STI;

forming a source/drain region in said semiconductor substrate adjacent to said gate electrode and adjacent to said STI;

covering said gate electrode and said STI with an insulating layer;

etching an opening through said insulating layer to said source/drain region wherein said silicon nitride spacer at said corner of said STI prevents etching of said STI; and filling said opening with a conducting layer to complete said formation of said contact in said fabrication of said integrated circuit device.

2. The method according to claim 1 further comprising growing a lining oxide layer within said shallow trench underlying said oxide material.

3. The method according to claim 1 wherein said sacrificial oxide layer has a thickness of between about 50 and 200 Angstroms.

4. The method according to claim 1 wherein said second silicon nitride layer has a thickness of between about 100 and 2000 Angstroms.

5. The method according to claim 1 wherein said gate electrode comprises polysilicon.

6. A method of forming a contact in the fabrication of an integrated circuit device comprising:

forming a shallow trench isolation (STI) region to separate an active area of a semiconductor substrate from other active areas comprising:

providing a pad oxide layer over the surface of said semiconductor substrate;

depositing a first silicon nitride layer over said pad oxide layer;

etching an opening in said first silicon nitride and said pad oxide layers where they are not covered by a mask;

etching into said semiconductor substrate underlying said opening to form a shallow trench;

depositing an oxide material over the surface of said first silicon nitride layer and within said shallow trench;

planarizing said oxide material to said surface of said first silicon nitride layer wherein said oxide material forms said STI region;

removing said first silicon nitride layer whereby said STI protrudes above said pad oxide layer;

removing said pad oxide layer whereby the corners of said STI above said semiconductor substrate are also removed;

forming a sacrificial oxide layer on the surface of said semiconductor substrate;

depositing a second silicon nitride layer overlying said sacrificial oxide layer;

etching away said second silicon nitride layer to leave silicon nitride spacers filling in and rounding said corners of said STI; and thereafter removing said sacrificial oxide layer;

forming a gate electrode on the surface of said semiconductor substrate in said active region;

forming a source/drain region in said semiconductor substrate adjacent to said gate electrode and adjacent to said STI;

covering said gate electrode and said STI with an insulating layer;

etching an opening through said insulating layer to said source/drain region wherein said silicon nitride spacer at said corner of said STI prevents etching of said STI; and filling said opening with a conducting layer to complete said formation of said contact in said fabrication of said integrated circuit device.

7. The method according to claim 6 further comprising growing a lining oxide layer within said shallow trench underlying said oxide material.

8. The method according to claim 6 wherein said sacrificial oxide layer has a thickness of between about 50 and 200 Angstroms.

9. The method according to claim 6 wherein said second silicon nitride layer has a thickness of between about 100 and 2000 Angstroms.

10. The method according to claim 6 wherein said gate electrode comprises polysilicon.

11. A method of forming shallow trench isolation in the fabrication of an integrated circuit device comprising:

providing a pad oxide layer over the surface of a semiconductor substrate;

depositing a first silicon nitride layer over said pad oxide layer;

etching an opening in said first silicon nitride and said pad oxide layers where they are not covered by a mask;

etching into said semiconductor substrate underlying said opening to form a shallow trench;

depositing an oxide material over the surface of said first silicon nitride layer and within said shallow trench;

planarizing said oxide material to said surface of said first silicon nitride layer wherein said oxide material forms said shallow trench isolation (STI) region;

removing said first silicon nitride layer whereby said STI protrudes above said pad oxide layer;

removing said pad oxide layer whereby the corners of said STI above said semiconductor substrate are also removed;

forming a sacrificial oxide layer on the surface of said semiconductor substrate;

depositing a second silicon nitride layer overlying said sacrificial oxide layer;

etching away said second silicon nitride layer to leave silicon nitride spacers filling in and rounding said corners of said STI; and thereafter removing said sacrificial oxide layer to complete said formation of said shallow trench isolation in said fabrication of said integrated circuit device.

12. The method according to claim 11 wherein said silicon nitride spacers at said corners of said STI prevents etching of said STI.

13. The method according to claim 11 further comprising growing a lining oxide layer within said shallow trench underlying said oxide material.

14. The method according to claim 11 further comprising:

forming a gate electrode on the surface of said semiconductor substrate in said active region;

forming a source/drain region in said semiconductor substrate adjacent to said gate electrode and adjacent to said STI;

covering said gate electrode and said STI with an insulating layer;

etching an opening through said insulating layer to said source/drain region wherein said silicon nitride spacer at said corner of said STI prevents etching of said STI; and filling said opening with a conducting layer.

15. The method according to claim 11 wherein said sacrificial oxide layer has a thickness of between about 50 and 200 Angstroms.

16. The method according to claim 11 wherein said second silicon nitride layer has a thickness of between about 100 and 2000 Angstroms.

* * * * *